United States Patent [19]
Miyata

[11] Patent Number: 5,519,373
[45] Date of Patent: May 21, 1996

[54] DIPOLE RING MAGNET FOR USE IN MAGNETRON SPUTTERING OR MAGNETRON ETCHING

[75] Inventor: Koji Miyata, Fukui, Japan

[73] Assignee: Shin-Etsu Chemical Co., Ltd., Tokyo, Japan

[21] Appl. No.: 365,528

[22] Filed: Dec. 28, 1994

[30] Foreign Application Priority Data

Dec. 28, 1993 [JP] Japan ................................. 5-351138
Dec. 28, 1993 [JP] Japan ................................. 5-351139
Dec. 28, 1993 [JP] Japan ................................. 5-351140
Dec. 28, 1993 [JP] Japan ................................. 5-351141

[51] Int. Cl.$^6$ ............................................... H01F 7/02
[52] U.S. Cl. ............................................... 335/306
[58] Field of Search ............................ 335/296–306; 310/152–156, 90.5; 204/298.16–298.22; 210/222

[56] References Cited

U.S. PATENT DOCUMENTS

| H693 | 10/1989 | Leupold | 335/216 |
|---|---|---|---|
| 4,538,130 | 8/1985 | Gluckstern et al. | 335/306 |
| 4,612,505 | 9/1986 | Zijlstra | 324/318 |
| 4,646,046 | 2/1987 | Vavrek et al. | 335/301 |
| 4,758,813 | 7/1988 | Holsinger et al. | 335/306 |
| 4,849,727 | 7/1989 | Sasaki et al. | 335/301 |
| 4,862,128 | 8/1989 | Leupold | 335/306 |
| 5,148,138 | 9/1992 | Miyata | 335/302 |

*Primary Examiner*—Leo P. Picard
*Assistant Examiner*—Raymond M. Barrera
*Attorney, Agent, or Firm*—Lowe, Price, LeBlanc & Becker

[57] ABSTRACT

The invention relates to a dipole ring magnet for use in magnetron sputtering apparatus or magnetron etching apparatus to produce a uniform magnetic field. Essentially the dipole ring magnet is an assembly of a plurality of pillar-like, anisotropic magnet segments in a circumferential arrangement. Each of the pillar-like magnet segments is magnetized in a direction normal to its longitudinal axis, and in assembling the ring magnet the magnet segments are differently oriented such that a magnetic field in the direction of a diameter of the ring is produced inside the ring magnet. To improve the uniformity of the magnetic field, particularly in respect of a component normal to the longitudinal axis of the ring magnet, each pillar-like segment is devoid of a lengthwise middle part to provide a vacant space in place of the middle part, and the length of the vacant space is regulated according to the position of the segment in the ring magnet.

13 Claims, 9 Drawing Sheets

DIPOLE RING MAGNET FOR USE IN MAGNETRON SPUTTERING OR MAGNETRON ETCHING

BACKGROUND OF THE INVENTION

This invention relates to a dipole ring magnet for use in either a magnetron sputtering apparatus or a magnetron etching apparatus to produce a magnetic field in the direction of a diameter of the ring magnet. Essentially the dipole ring magnet is an assembly of a plurality of anisotropic permanent magnet segments in a circumferential arrangement.

In the recent electric and electronic industries, magnetron sputtering and magnetron etching are widely employed since the efficiency of sputtering or etching can be greatly enhanced by utilizing a high-density plasma generated by a discharge of electricity in a magnetic field.

A permanent magnet unit is essential to a magnetron sputtering or etching apparatus. For example, in conventional magnetron sputtering apparatus of a planar diode type it is usual to use a magnet unit consisting of an annular permanent magnet, another permanent magnet in the shape of a disk which is coaxially placed inside the annular magnet and a yoke plate which connects one end face of the disk magnet to one end face of the annular magnet. The magnet unit is adjacent to one of the planar electrodes, and a planar target is placed on this electrode to face a substrate on the opposite electrode. Accordingly a doughnut-like magnet field is produced within the space between the two electrodes, and a high-density plasma is generated over the target surface by the interaction of the magnetic field and an electric field in the direction parallel to the axis of the annular magnet.

However, the above described permanent magnet unit has a disadvantage in respect of the uniformity of the magnetic field. That is, in a horizontal plane close to and parallel to the target surface, a component of the magnetic field that is parallel to the target surface and normal to the direction of the electric field does not make a uniform distribution. Such a component of the magnetic field will be referred to as horizontal magnetic field. In the plane in question the strength of the horizontal magnetic field greatly varies with radial distance from the center of the target on the center axis of the annular magnet, and accordingly the density of the plasma over the target surface becomes very uneven. Since the sputtering efficiency depends on the density of the plasma the target is unevenly consumed, and consequently the utilization efficiency of the target lowers. This is a serious problem from an economical point of view since in most cases the target is an expensive material.

In the case of a magnetron etching apparatus using the above described permanent magnet unit, the unevenness of the plasma density causes uneven etching such as locally excessive etching of a wafer. Besides, there is a possibility of breakage of the wafer by a distribution of potential within the wafer surface induced by the uneven density of the plasma.

In view of the above problems there is the idea of using a dipole ring magnet to produce a uniform magnetic field for magnetron sputtering or etching. The dipole ring magnet has a plurality of pillar-like magnet segments each of which is an anisotropic permanent magnet magnetized in a direction normal to its longitudinal axis. The pillar-like magnets are held in a circumferential arrangement by a nonmagnetic retainer in the form of a hollow cylinder, and the pillar-like magnets are differently oriented so as to produce a magnetic field in the direction of a diameter of the ring magnet within the cylindrical space in the ring. In a plane close to the middle cross section of the dipole ring magnet the magnetic field becomes a horizontal magnetic field, and the uniformity of this horizontal magnetic field is very good by comparison with the horizontal magnetic field produced by the above-described conventional permanent magnet unit.

However, a problem remains in practically using the dipole ring magnet for magnetron sputtering or etching. That is, when the length of the dipole ring magnet (length of the pillar-like anisotropic magnet segments) is relatively short the horizontal magnetic field inside the ring magnet is not sufficiently uniform. The strength of the horizontal magnet field becomes lowest around the center axis of the ring magnet and gradually rises as radial distance from the center axis increases. Furthermore, the rate of such a variation in the field strength varies with the angle of radius with the direction of the magnetic field. It is possible to sufficiently improve the uniformity of the magnetic field by lengthening the dipole ring magnet, but for application to practical magnetron sputtering or etching apparatus it is difficult to desirably lengthen the dipole ring magnet.

SUMMARY OF THE INVENTION

It is an object of the present invention to provide a dipole ring magnet which produces a horizontal magnetic field of sufficiently good uniformity even though the length of the ring magnet is relatively short.

A dipole ring magnet according to the invention comprises a plurality of pillar-like magnet segments each of which is an anisotropic permanent magnet magnetized in a direction normal to its longitudinal axis. The pillar-like magnet segments are arranged around a circumference and differently oriented such that the directions of magnetization of the arranged magnet segments make two 360-degree turns around the circumference and such that a magnetic field in the direction of a diameter of the circumference is produced inside the dipole ring magnet. In this dipole ring magnet, each of the pillar-like magnet segments is devoid of a lengthwise middle part to provide a vacant space in place of the middle part, and the length of the vacant space is regulated according to the position of the magnet segment in the dipole ring.

In the dipole ring magnet according to the invention, the vacant spaces in the pillar-like magnet segments serve the purpose of sufficiently improving the uniformity of a horizontal magnetic field inside the ring magnet without increasing the length of the ring magnet. Therefore, dipole ring magnets according to the invention are very favorable for industrial magnetron sputtering and magnetron etching. In the case of magnetron sputtering it is possible to greatly enhance the utilization efficiency of the target. In the case of magnetron etching it is possible to accomplish high-quality etching.

The invention includes some optional and supplemental features as will be described hereinafter.

DESCRIPTION OF THE PREFERRED EMBODIMENTS

Figure 1:
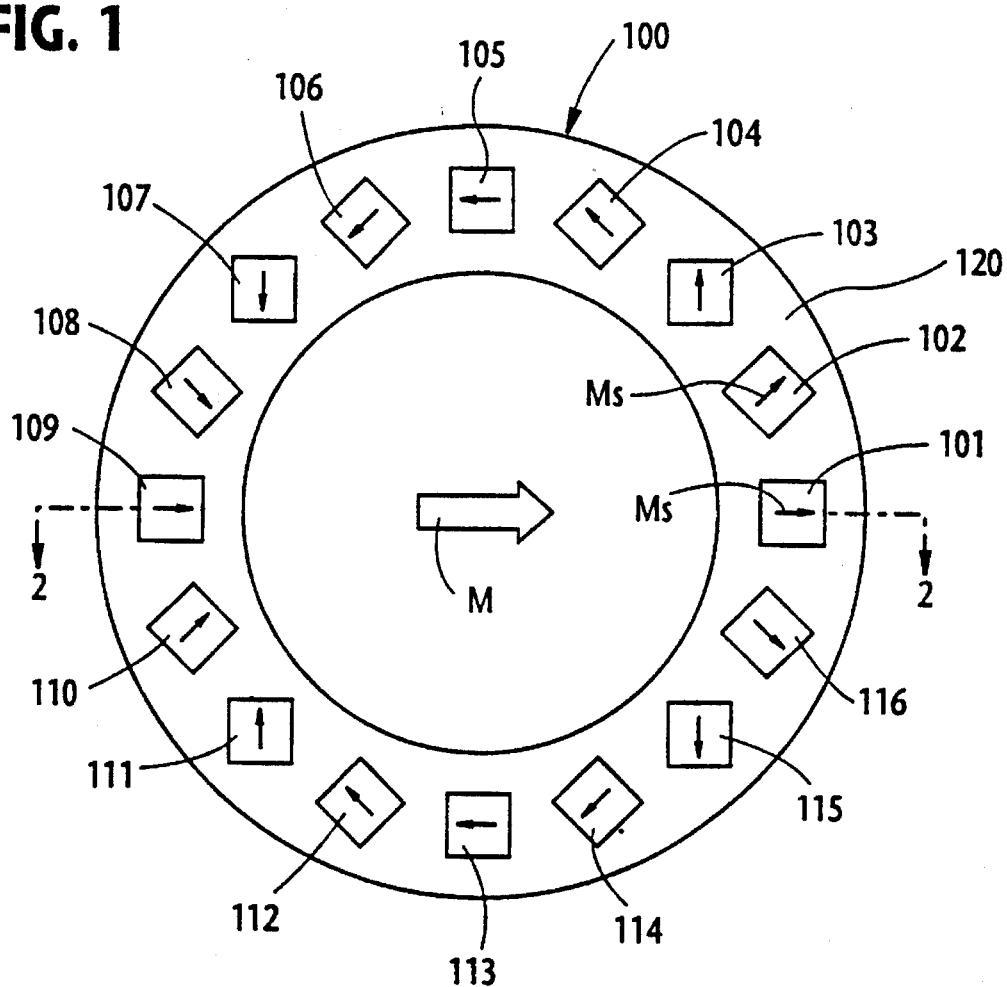
FIG. 1 is a plan view of a dipole ring magnet according to the invention.
Figure 2:
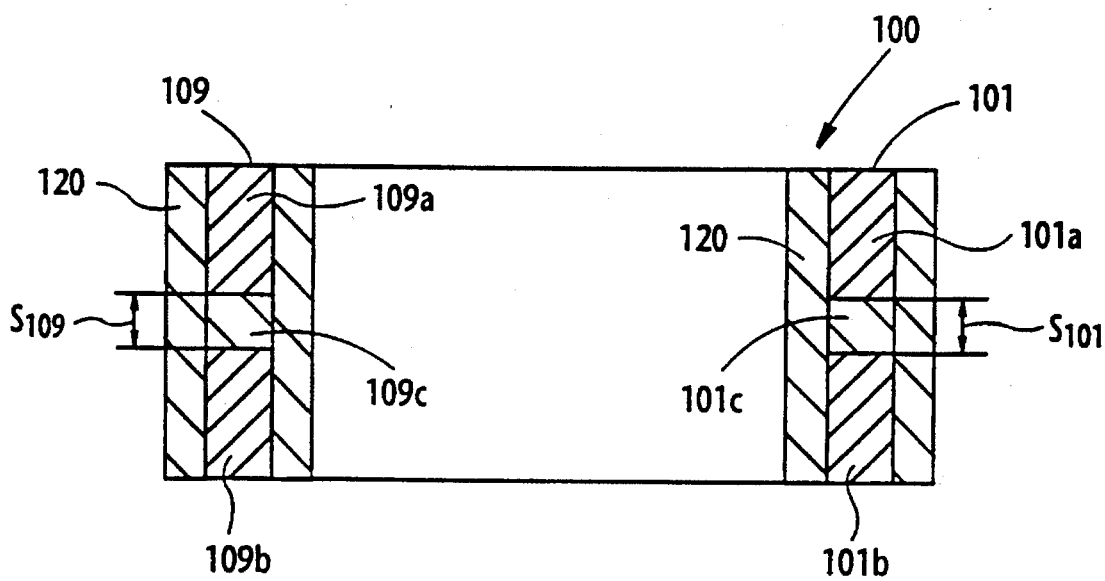
FIG. 2 is a sectional view taken along the line 2—2 in FIG. 1.

FIGS. 1 and 2 show a dipole ring magnet 100 which is an embodiment of the invention.

The dipole ring magnet 100 is constructed of a nonmagnetic retainer 120 in the form of a hollow cylinder and sixteen pillar-like magnet segments 101, 102, ... , 116 which are embedded in the retainer 120 in a circumferential arrangement so as to stand parallel to the longitudinal axis of the cylindrical retainer 120. Each of these sixteen magnet segments 101, 102, ... , 116 is an anisotropic permanent magnet which is magnetized in the direction indicated by arrow $M_s$. As the anisotropic permanent magnet, it is preferred to use a rare earth-iron based magnet such as, for example, Nd—Fe—B magnet. In assembling the dipole ring magnet 100 the anisotropic magnet segments 101, 102, ... , 116 are differently oriented so as to provide an N pole and an S pole on the inside of the ring magnet at a 180-degree interval and consequently produce a magnetic field in the direction of arrow M in FIG. 1, i.e. in the direction of a diameter of the ring magnet 100. As shown in FIG. 1, in the dipole ring magnet 100 the directions of magnetization $M_s$ of the segments 101, 102, ... , 116 change stepwise to make two 360-degree turns around a circumference.

In a dipole ring magnet according to the invention the number of the pillar-like magnet segments is not limited to 16. It is necessary to use at least 8 segments, and usually it is unnecessary to use more than 32 segments. The cross-sectional shape of the pillar-like segments is arbitrary. For example, the cross-sectional shape may be circular or rectangular. In this embodiment the square cross-sectional shape is employed in view of relatively low cost of production.

Referring to FIG. 2, each of the pillar-like magnet segments 101, 102, ... , 116 has a vacant space in a lengthwise middle part. In other words, each segment consists of two pillar-like magnet parts which are aligned with and spaced from each other. The segment 101 consists of two magnet parts 101a and 101b which have approximately the same length, and there is a vacant space 101c between the two parts 101a and 101b. Similarly, the other segments 102, 103, ... , 116 have vacant spaces 102c, 103c, ... , 116c, respectively. In each segment (e.g. 101) the length (e.g. $S_{101}$) of the vacant space (e.g. 101c) is set at a suitable value according to the position of that segment in the dipole ring magnet 100. Therefore, the sixteen segments 101, 102, ... , 116 have vacant spaces 101c, 102, ... , 116c of various lengths $S_{101}, S_{102}, \ldots, S_{116}$. In the two segments 101 and 109 in which the direction of magnetization accords with a diameter of the ring magnet 100, the length $S_{101}, S_{109}$ of the vacant space 101c, 109c is made greater than in the other segments since these two segments 101, 109 make the greatest contribution to the magnetic field in the direction of arrow M. In the other segments the lengths of the vacant spaces are reduced according to the degrees of less contributions to the horizontal magnetic field. That is, the lengths of the vacant spaces are regulated so as to meet the following conditions.

$S_{101} = S_{109}$ $S_{102} = S_{108} = S_{110} = S_{110}$ $S_{103} = S_{107} = S_{111} = S_{115}$ $S_{104} = S_{106} = S_{112} = S_{114}$ $S_{105} = S_{113}$ $S_{101} > S_{102} > S_{103} > S_{104} > S_{105}$

Figure 3:
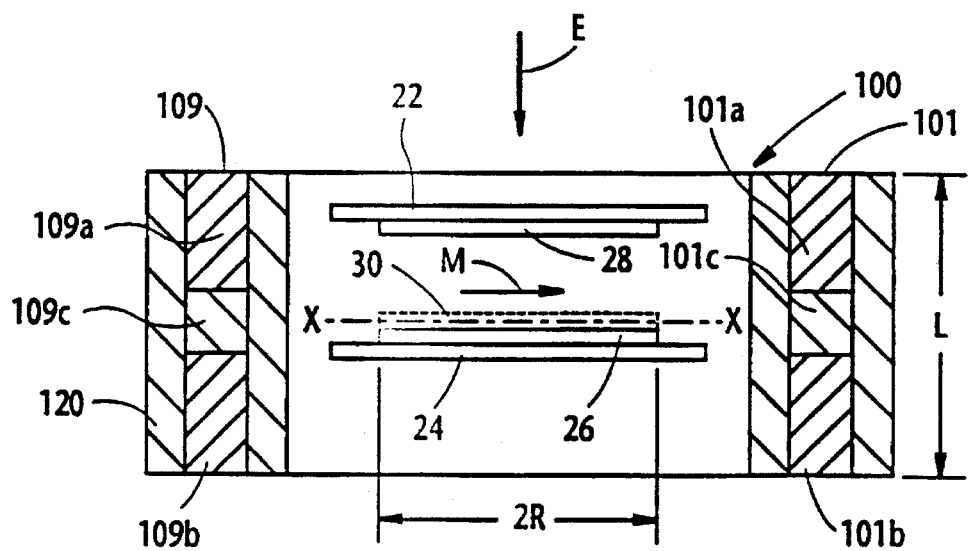
FIG. 3 is an elevational sectional view of the principal part of a magnetron sputtering apparatus using the dipole ring magnet of FIGS. 1 and 2.

FIG. 3 shows the use of the dipole ring magnet 100 of FIGS. 1 and 2 in a magnetron sputtering apparatus. In a sputtering chamber and inside the dipole ring magnet 100, a pair of planar electrodes 22 and 24 are arranged opposite to each other and parallel to cross-sections of the ring magnet 100. A target 26 is on the electrode 24, and on the opposite electrode 22 a substrate 28 is held opposite to the target 26. There is a magnetic field in the direction of arrow M in the cylindrical space inside the dipole ring magnet 100. In the middle cross section of the dipole ring magnet 100 the magnetic field has substantially no vertical components (parallel to the longitudinal axis of the ring magnet) and hence can be regarded as a horizontal magnetic field, and in the middle section the degree of uniformity of the magnetic field is better than in end sections. In view of these facts the vertical position of the target 26 is adjusted such that the target surface is close to the middle cross section of the ring magnet 100. A sputtering gas such as argon gas is confined in the sputtering chamber, and a RF voltage is applied between the two electrodes 22 and 24 to produce an electric field in the direction of arrow E, i.e. in the direction normal to the direction of the magnetic field (arrow M). The sputtering gas is ionized by the discharge between the two electrodes 22 and 24, and the liberated electrons are restrained over and close to the surface of the target 26 by the interaction of the electric field and the magnetic field. The restrained electrons promote further ionization of the sputtering gas so that the ionization efficiency is greatly enhanced. Consequently a high-density plasma is maintained in a limited space 30 over the target 26. This space 30 will be called a plasma generating zone.

Figure 5:
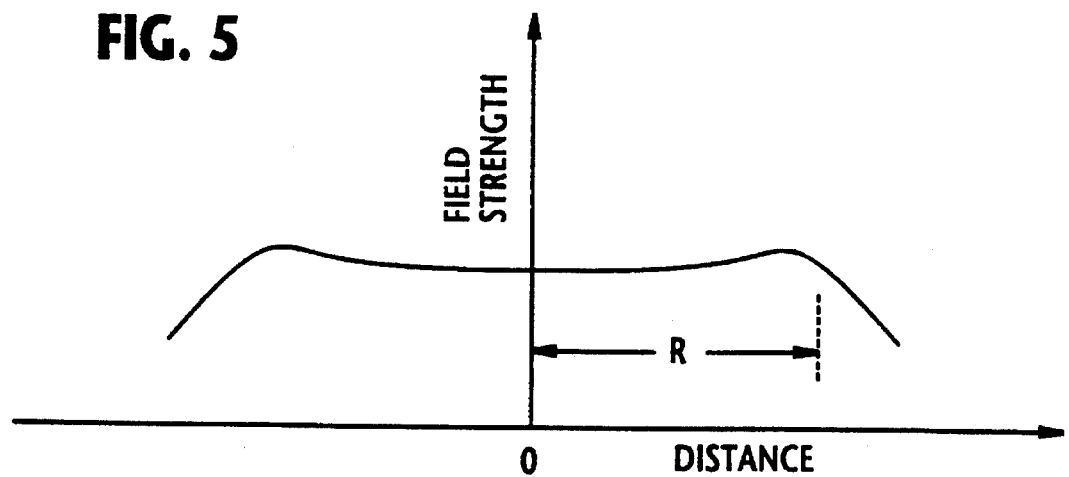
FIGS. 5 and 6 are charts showing the distribution of the strengths of a horizontal magnetic field produced inside the dipole ring magnet of FIGS. 1 and 2.
Figure 6:
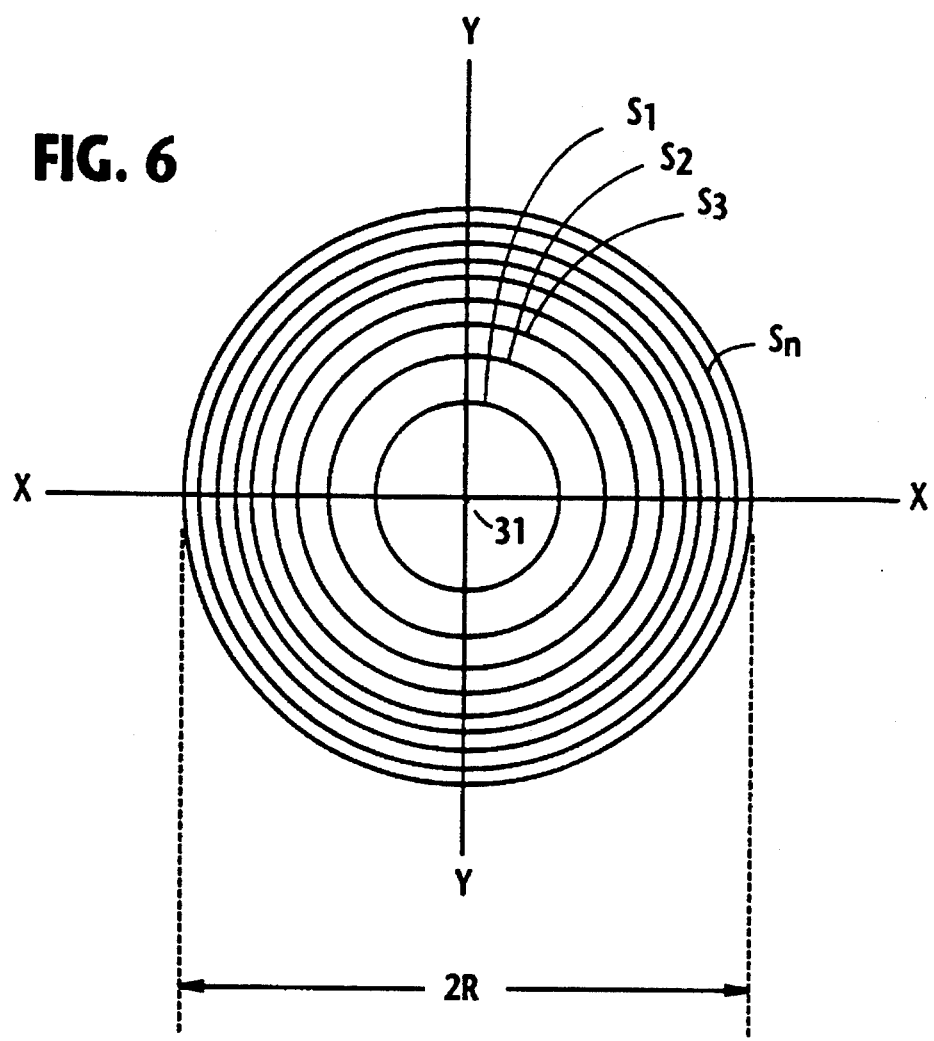

In FIG. 3, line X—X is in a horizontal plane of the middle cross section of the plasma generating zone 30, and it is assumed that the middle section of the zone 30 coincides with the middle section of the dipole ring magnet 100. FIG. 5 shows a variation in the strength of the horizontal magnetic field on the line X—X with distance from the center point 31 of the plasma generating zone 30. On the abscissa the distances in the right-hand direction in FIG. 3 are taken as positive. In FIGS. 3 and 5 the character R represents the radius of the plasma generating zone 30. FIG. 6 shows the distribution of the strength of the horizontal magnetic field in the middle section of the plasma generating zone 30. Line Y—Y in FIG. 6 is in the middle section of the plasma generating zone 30 and perpendicularly intersects the line X—X at the center point 31. The closed (circular) curves $S_1$, $S_2$, . . . , $S_n$ are isostrength lines each of which connects points of equal strength of horizonal magnetic field. In FIGS. 5 and 6 it is seen that the horizontal magnetic field is very good in uniformity over nearly the whole area of the plasma generating zone 30.

Figure 7:
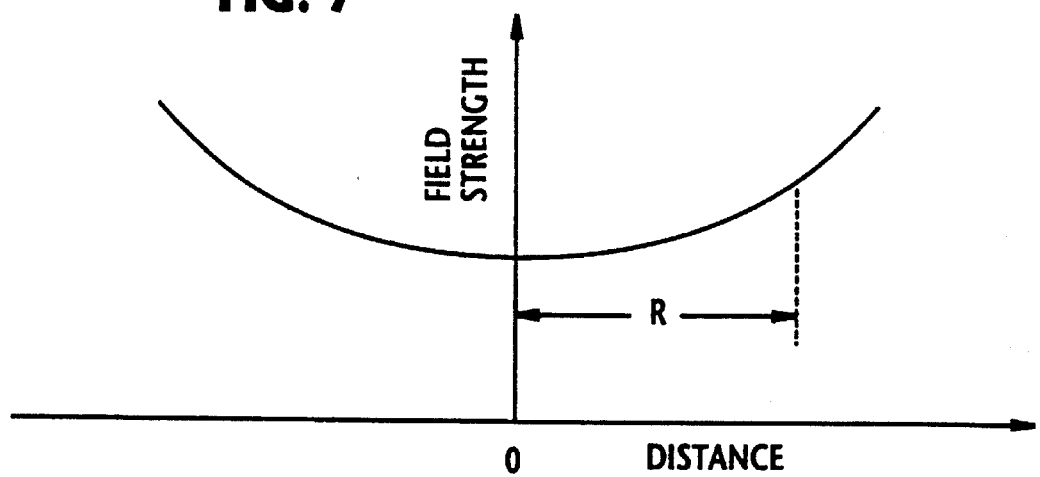
FIGS. 7 and 8 are charts showing the distribution of the strengths of a horizontal magnetic field produced inside a dipole ring magnet not in accordance with the invention.
Figure 8:
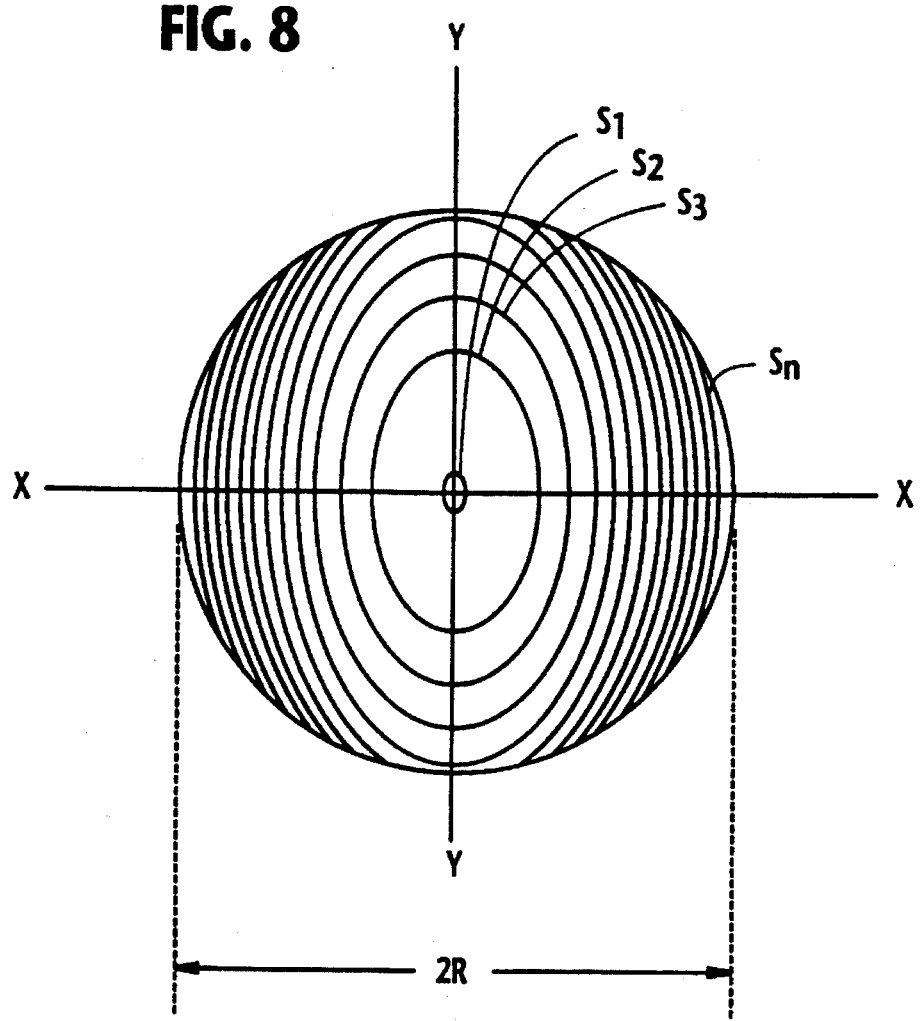

For comparison, when each of the pillar-like magnets 101, 102, . . . , 116 in the dipole ring magnet 100 is a completely solid (gapless) unitary member having the length L indicated in FIG. 3, the distributions of the strengths of horizontal magnetic field in the middle section of the plasma generating zone 30 become as shown in FIGS. 7 and 8, which correspond to FIGS. 5 and 6, respectively. In this case the field strength becomes considerably higher from the center of the plasma generating zone toward peripheral regions, and, as can be seen in FIG. 8, the distribution of the Field strengths in the middle section becomes considerably uneven with respect to radial directions Form the center point 31. For example, there is the greatest difference between the distribution in the direction of line X—X and the distribution in the direction of the perpendicular line Y—Y.

In the case of the dipole ring magnet 100 in FIG. 3, the Field strength on the line X—X becomes very uniform as can be seen in FIG. 5. This is the effect of providing the vacant spaces $101_c$, $102_c$, . . . , $116_c$ in the pillar-like magnets 101, 102, . . . , 116 by removing lengthwise middle parts of the pillar-like magnets. Without the vacant spaces, lengthwise middle parts of the pillar-like magnets make great contributions to the strength of horizontal magnetic Field in regions near the periphery of the plasma generating zone 30 and only small contributions to the Field strength in central regions of the zone 30. The removal of the middle parts of the pillar-like magnets brings about a considerable reduction in the field strength in regions near the periphery of the plasma generating zone 30, and consequently the horizontal magnetic Field improves in uniformity. Furthermore, as can be seen in FIG. 6, the distribution of the strength of horizontal magnetic field becomes nearly even in every radial direction from the center off the plasma generating zone. This is the effect of regulating the lengths $S_{101}$, $S_{102}$, . . . , $S_{116}$ of the vacant spaces 101c, 102c, . . . , 118c in the pillar-like magnets with consideration of the degrees of the effects of the respective pillar-like magnets on the horizontal magnetic Field in the direction of arrow M.

If it is intended to obtain a dipole ring magnet which is comparable to this dipole ring magnet 100 in the uniformity of horizontal magnetic field by increasing the length L of the magnet instead of providing vacant spaces in the pillar-like magnets, it is necessary to nearly double the length L.

Figure 4:
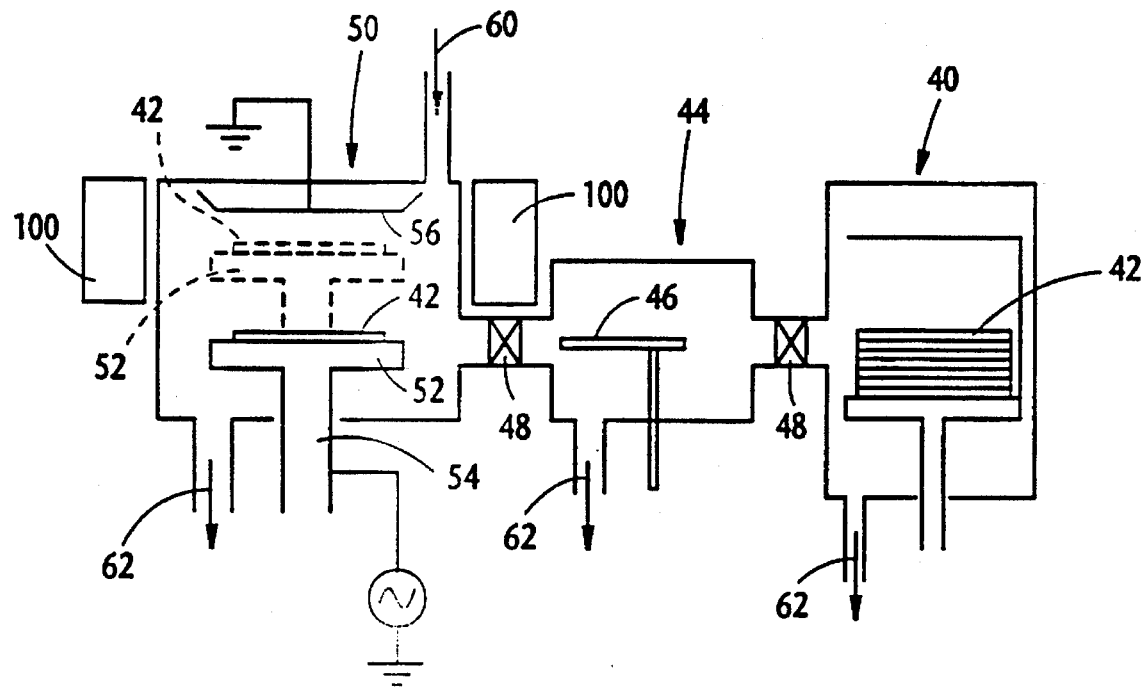
FIG. 4 is a schematic illustration of a magnetron etching apparatus using a dipole ring magnet according to the invention.

FIG. 4 illustrates the use of the dipole ring magnet 100 according to the invention in a magnetron etching apparatus. The apparatus has a cassette chamber 40 wherein a plurality of wafers 42 are kept stacked, a load-lock chamber 44 which is provided with a wafer transferring arm 46 and a sputtering chamber 50. Numeral 48 indicates valves in the passageways connecting the load-lock chamber 44 to the cassette chamber 40 and to the etching chamber 50. In the etching chamber 50, a planar electrode 52 is provided as an integral part of a support 54 which can be moved upward and downward, and an opposite planar electrode 56 is held inside the dipole ring magnet 100 and above the electrode 52. A wafer 42 is transferred from the cassette chamber 40 into the etching chamber 50 and placed on the electrode 52. Then the support 54 is moved upward until the wafer 42 on the electrode 52 reaches the etching position (shown by broken line) at a short distance from the opposite electrode 56. The apparatus is evacuated as indicated by arrows 62, and a process gas indicated by arrow 60 is introduced into the etching chamber 50. Then a RF voltage is applied between the two electrodes 52 and 56 to produce a magnetron plasma over the wafer surface by the interaction of the electric field and a horizontal magnetic field produced by the dipole ring magnet 100. The etching position of the wafer 42 is determined such that the middle cross section of the ring magnet 100 lies in a plasma generating zone over the wafer surface.

Figure 9:
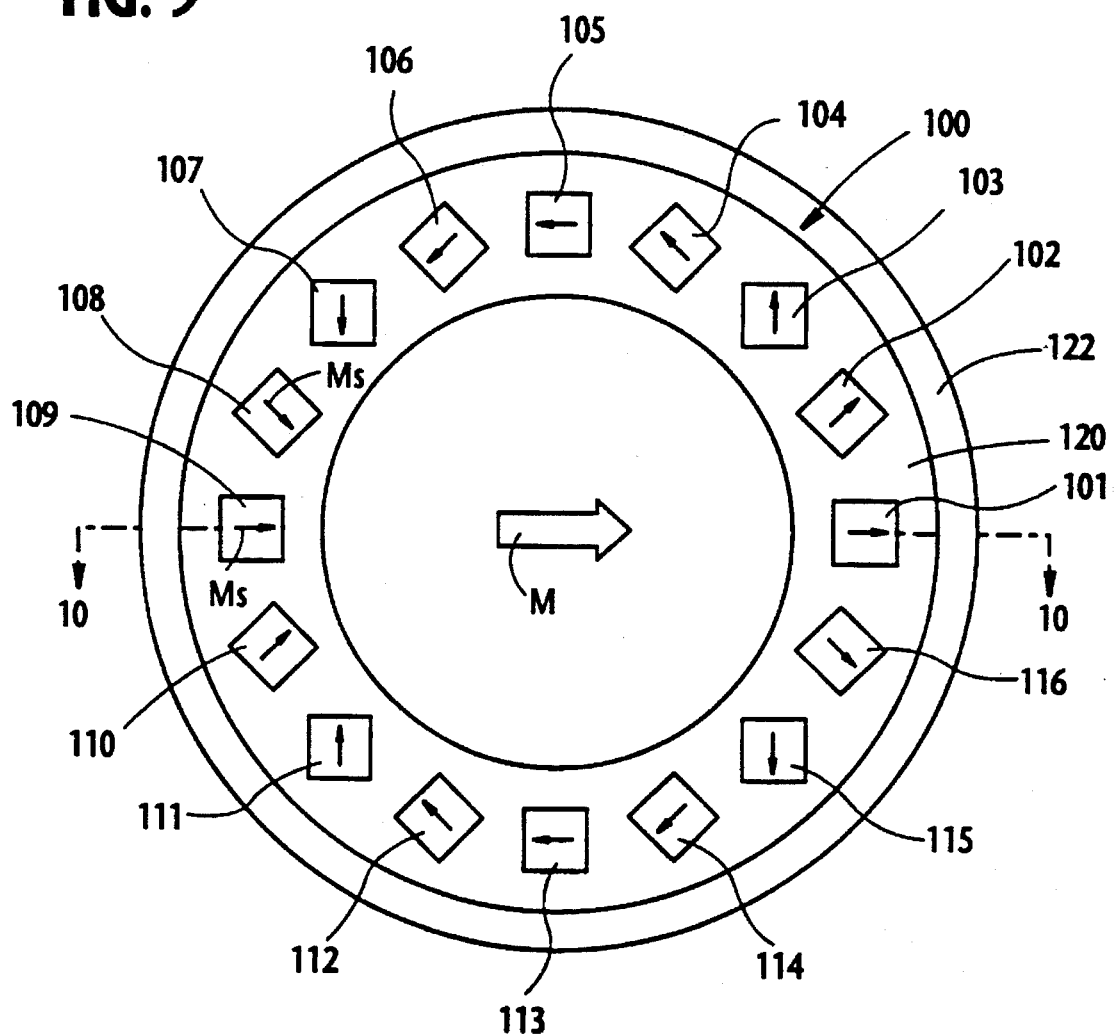
FIGS. 9 and 10 show a modification of the dipole ring magnet of FIGS. 1 and 2 in plan and sectional views, respectively.
Figure 10:
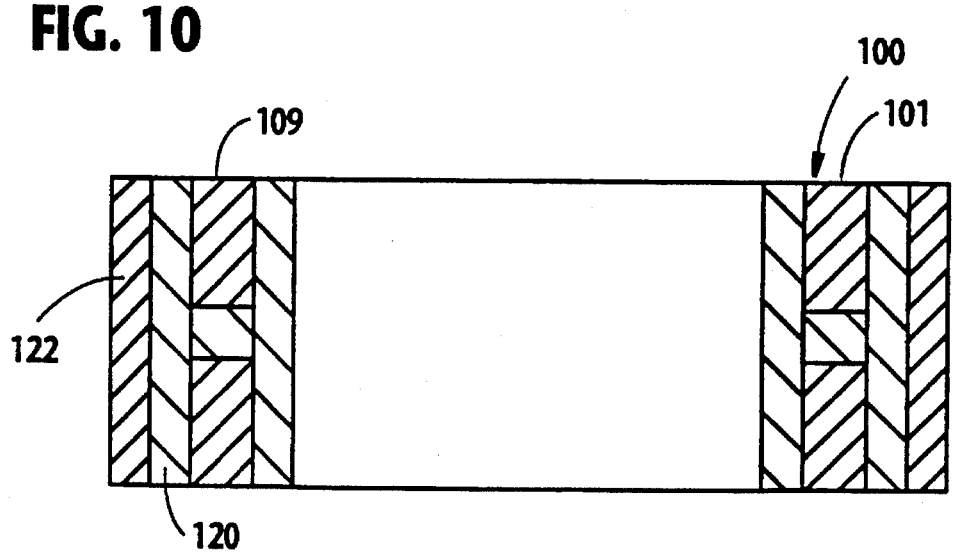

FIGS. 9 and 10 show modifying the dipole ring magnet 100 of FIGS. 1 and 2 by adding a covering 122, which is made of a ferromagnetic material and tightly covers the outside surface of the cylindrical retainer 120. It is suitable to use a ferromagnetic material that is relatively high in saturation magnetization, such as soft iron.

An advantage of the addition of the ferromagnetic covering 122 is that the strength of the horizontal magnetic field inside the dipole ring magnet 100 augments by about 10%. This is because of a contribution of magnetic moment induced by the passage of some magnetic fluxes leaked from the dipole ring magnet 100 through the ferromagnetic covering 122. Therefore, if it is unnecessary to augment the field strength, it is possible to reduce the total mass of the pillar-like anisotropic magnets 101, 102, . . . , 116 to thereby reduce the cost of production.

Furthermore, the ferromagnetic covering 122 protects the horizontal magnetic field inside the dipole ring magnet 100 from undesirable influences of another magnet. In the industrial practice of magnetron sputtering or magnetron etching it is often to install a plurality of sputtering or etching apparatus at short distances. When two dipole ring magnets are placed at a short distance with each other, the distribution of the strength of magnetic field in each dipole ring magnet is disturbed by fluxes leaked from the other ring magnet. For example, when a dipole ring magnet 100 of FIGS. 1 and 2 is placed close to and on the right-hand or left-hand side of the dipole ring magnet 100 in FIG. 3, the strength of horizontal magnetic field in each ring magnet considerably augments in one end region of the plasma producing zone 30 nearer to the other ring magnet, so that the uniformity of the horizontal magnetic field is considerably degraded. When the two dipole ring magnets 100 have the ferromagnetic covering 122 of FIGS. 9 and 10, the covering 122 on each ring magnet interrupts the fluxes leaked from the other ring magnet and minimizes the intrusion of leakage fluxes into the space inside the ring magnet. Therefore, the amount of the local augmentation of the field strength in each ring magnet becomes very small so that the uniformity of the horizontal magnetic field is not significantly degraded. Thus, the addition of the ferromagnetic covering 122 to dipole ring magnets according to the invention is very favorable for the installation of a plurality of magnetron sputtering or etching apparatus at short distances.

Figure 11:
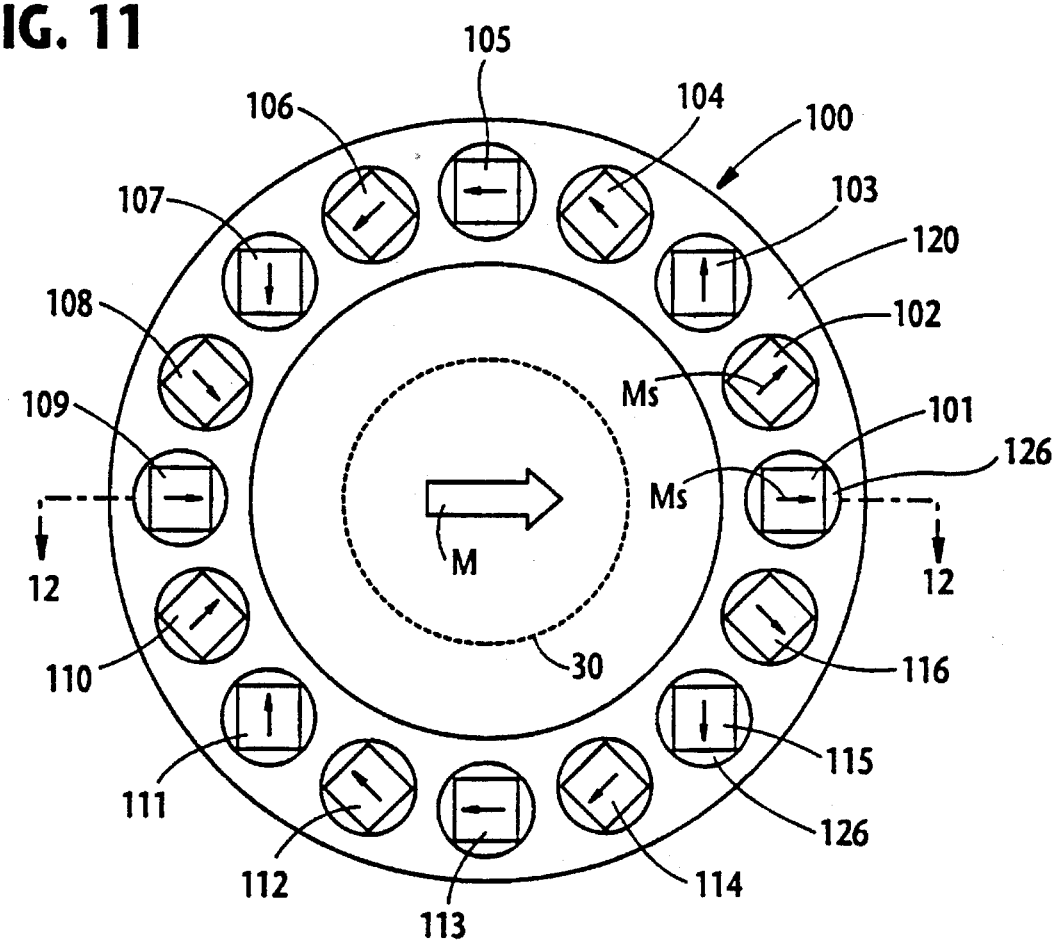
FIGS. 11 and 12 show another modification of the dipole ring magnet of FIGS. 1 and 2 in plan and simplified sectional views, respectively.
Figure 12:
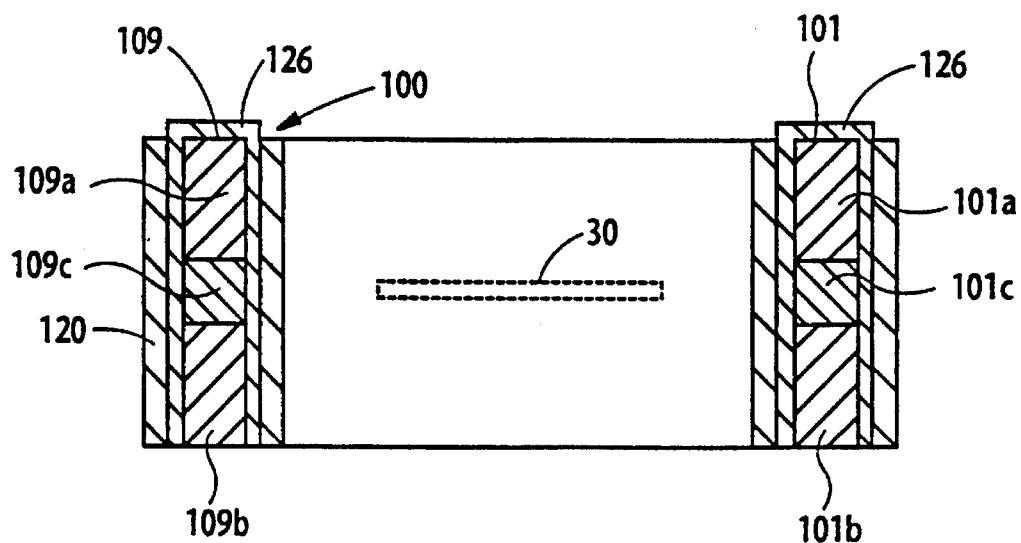

FIGS. 11 and 12 show another modification of the dipole ring magnet 100 of FIGS. 1 and 2. In this case, each of the pillar-like magnets 101, 102, . . . , 116 is provided with a rotation mechanism 126 such that each pillar-like magnet in the retainer 120 can be turned about its longitudinal center axis by a desired angle. The rotation mechanisms 1.26 are provided in view of the following problem.

In industrial production of the dipole ring magnet 100, some dispersion of the magnetic characteristics of the pillar-like anisotropic magnets 101, 102, . . . , 116 is inevitable. Therefore, it is difficult to accurately realize the designed degree of uniformity of the magnetic field in the plasma generating zone 30. For example, when only the pillar-like magnet 105 is about 5% lower in magnetic characteristics than the remaining fifteen pillar-like magnets, the uniformity of the strength of horizontal magnetic field in the direction of the line Y—Y in FIG. 6 becomes worse than in the direction of the line X—X because of weakening of the field strength in a region nearest to the magnet 105.

In the case of the dipole ring magnet 100 of FIGS. 11 and 12, degradation of the degree of uniformity of the horizontal magnetic field attributed to unequal magnetic characteristics of some of the pillar-like magnets 101, 102, . . . , 116 can be remedied by turning some or all of the pillar-like magnets individually by suitable angles. That is, it is possible to minutely adjust the distribution of the strength of horizontal magnetic field in the plasma generating zone 30 by selectively turning the pillar-like magnets 101, 102. . . , 116 after inserting the pillar-like magnets into the retainer 120.

Figure 13:
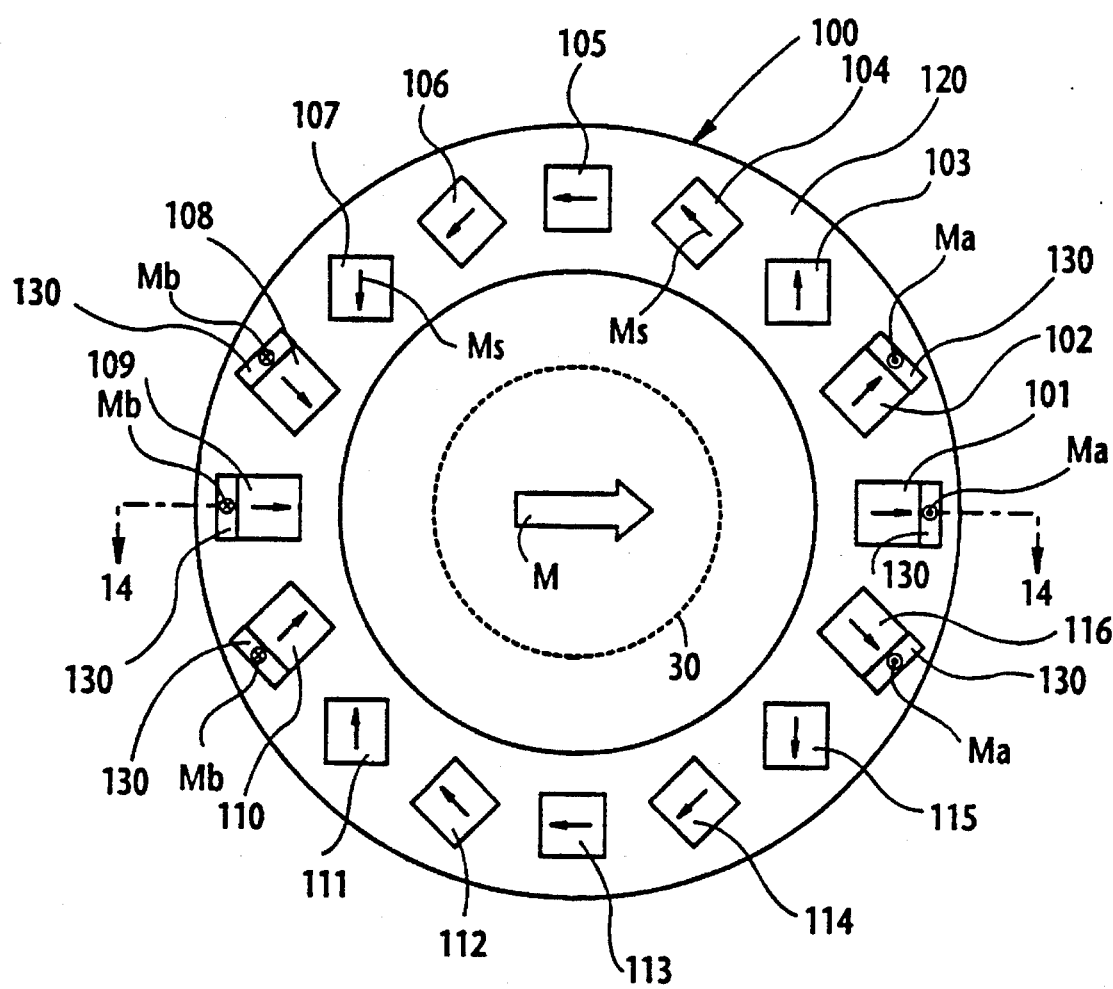
FIGS. 13 and 14 show a third modification of the dipole ring magnet of FIGS. 1 and 2 in plan and sectional views, respectively.
Figure 14:
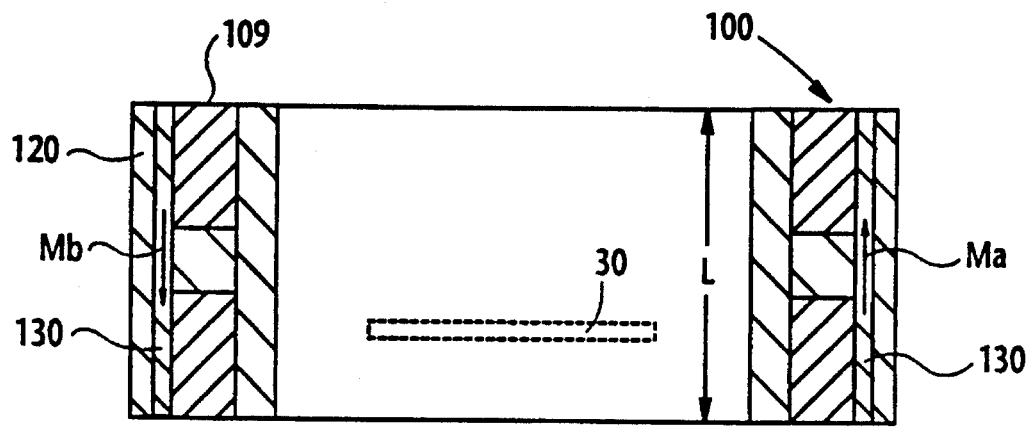

FIGS. 13 and 14 show a different modification of the dipole ring magnet 100 of FIGS. 1 and 2. The dipole ring magnet of FIGS. 13 and 14 is suitable for use in a magnetron etching apparatus as shown in FIG. 4.

The modification is attaching an auxiliary anisotropic permanent magnet 130 to some of the pillar-like anisotropic magnets 101, 102, . . . , 116 so as to partly or entirely cover the side faces of each of the pillar-like magnets in question. The auxiliary anisotropic magnet 130 is magnetized in a direction parallel to the longitudinal axis of each pillar-like magnet 101, 102, . . . , 116. In the illustrated embodiment the auxiliary anisotropic magnet 130 is attached to six pillar-like magnets 101, 102, 108, 109, 110 and 116 so as to cover one side face of each of these six pillar-like magnets. The auxiliary anisotropic magnets 130 on the three pillar-like magnets 101, 102 and 116 are magnetized in the direction of arrow $M_a$ in FIG. 14 (symbol $M_a$ in FIG. 18), and the auxiliary anisotropic magnets 130 on the other three pillar-like magnets 108, 109 and 110 are magnetized in the reverse direction, i.e. in the direction of arrow $M_b$ in FIG. 14 (symbol $M_b$ in FIG. 13). This modification is made for the following reasons.

Figure 18:
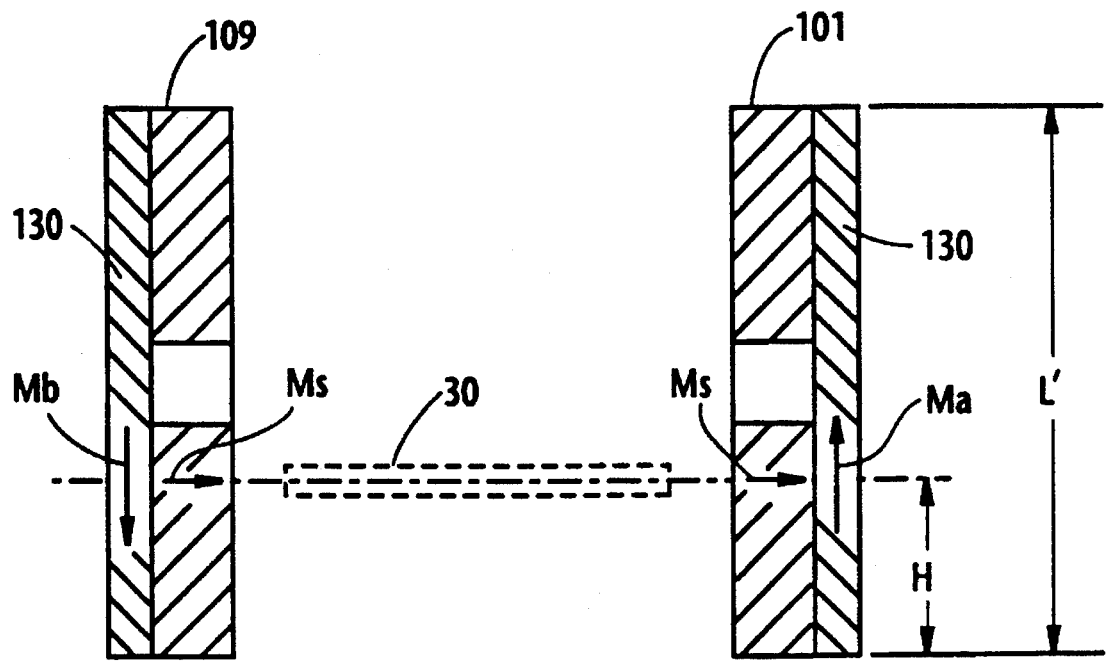

In the case of the dipole ring magnet of FIGS. 1 and 2, a horizontal magnetic field is produced in the lengthwise middle section of the ring magnet. Therefore, when the dipole ring magnet of FIGS. 1 and 2 is used in the magnetron etching apparatus of FIG. 4 the etching position of the wafer 42 shown by broken line must be in close proximity to the middle cross section of the ring magnet 100. For enhancing the degree of uniformity of the horizontal magnetic field it is effective to increase the length L of the dipole ring magnet 100. However, when the magnet length L is increased the amount of the ascent of the electrode 52 (on which the wafer 42 is placed) to the etching position increases, and accordingly the etching chamber 50 needs to be enlarged, and therefore the equipment and operation costs increase. When the dipole ring magnet of FIGS. 18 and 14 is used it becomes possible to increase the magnet length L without raising the need of increasing the amount of the ascent of the electrode 52 to the etching position.

Figure 15:
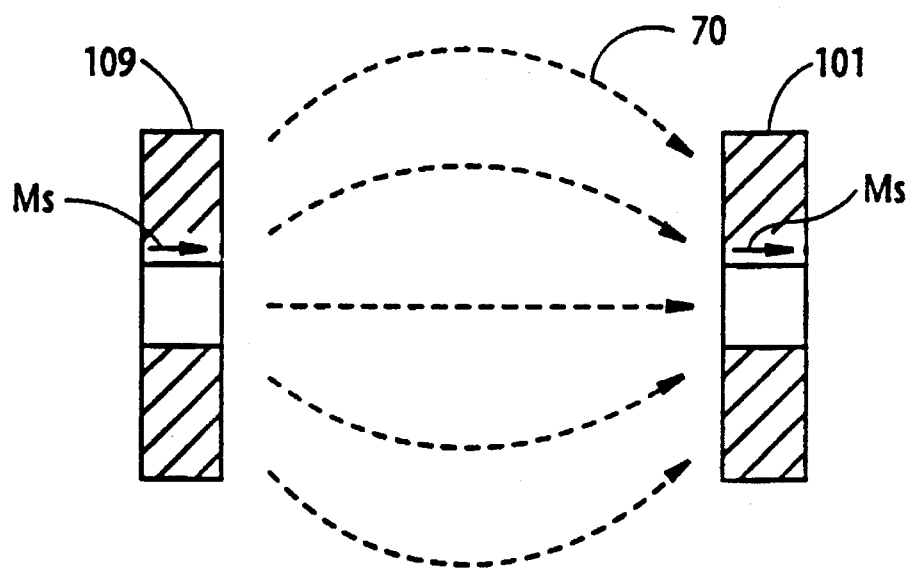
FIGS. 15 and 16 are explanatory illustrations of the lines of flux in the dipole ring magnets of FIGS. 1–2 and FIGS. 13–14, respectively.
Figure 16:
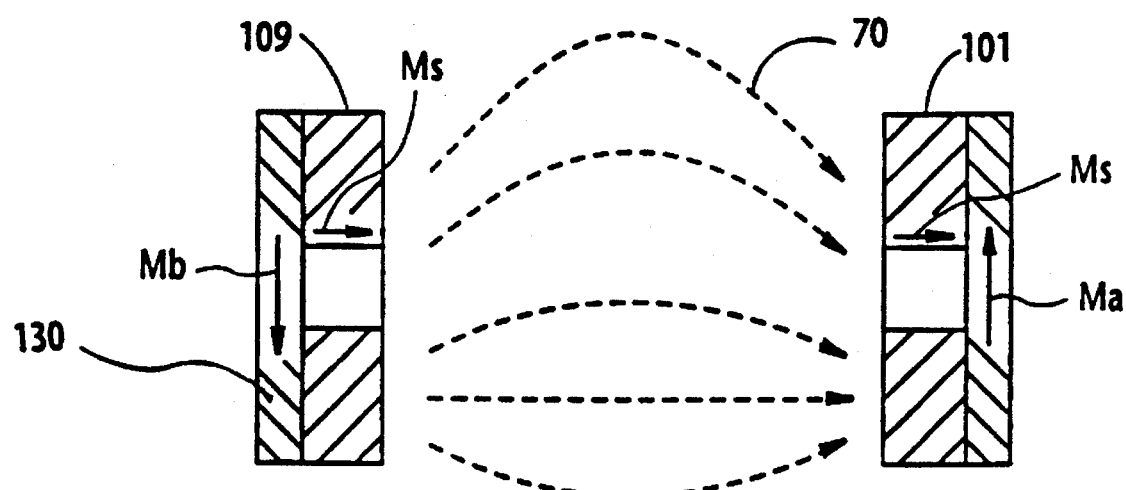
Figure 17:
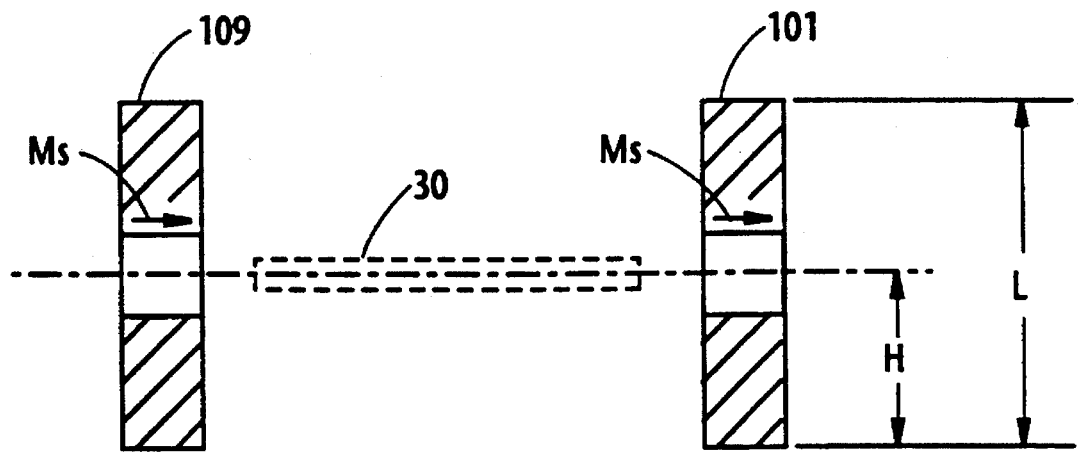
FIGS. 17 and 18 are explanatory illustrations of horizontal magnetic fields produced inside the dipole ring magnets of FIGS. 1–2 and FIGS. 13–14, respectively.

FIG. 15 illustrates lines of flux 70 inside the dipole ring magnet of FIGS. 1 and 2. It is seen that a horizontal magnetic field is realized in the middle cross section of the ring magnet. FIG. 16 illustrates lines of fulx 70 inside the dipole ring magnet of FIGS. 13 and 14. In this case a horizontal magnetic field is realized in a section near to the lower end of the ring magnet. This is because the magnetic field produced by the original dipole ring magnet is modified by magnetic fields produced by the auxiliary anisotropic magnets 130 (magnetized in the direction of arrow $M_a$ or $M_b$). Therefore, when the dipole ring magnet of FIGS. 13 and 14 is used in the magnetron etching apparatus of FIG. 4 the etching position is near to the lower end of the ring magnet 100. In this case the amount of the ascent of the electrode 52 to the etching position is relatively small even though the length L of the dipole ring magnet is increased. Referring to FIG. 17, when the dipole ring magnet of FIGS. 1 and 2 is used the middle section of the plasma generating zone 30 is at height H from the lower end of the ring magnet, and in this case the height H is approximately ½ of the length L of the ring magnet. Referring to FIG. 18, when the dipole ring magnet of FIGS. 13 and 14 is used the length of the ring magnet can be increased to L' without changing the height H of the plasma generating zone and in this case the horizontal magnetic field in the plasma generating zone 30 is better in the degree of uniformity than the horizontal magnetic field in the case of FIG. 17. If the magnet length L' in FIG. 18 is equal to L in FIG. 17, the height of the plasma generating zone 30 in FIG. 18 becomes considerably smaller than H.

What is claimed is:

1. A dipole ring magnet for use in magnetron sputtering or magnetron etching, comprising a plurality of pillar-like magnet segments each of which is an anisotropic permanent magnet magnetized in a direction normal to its longitudinal axis, said pillar-like magnet segments being arranged around a circumference of said dipole ring magnet and differently oriented such that the directions of magnetization of the arranged magnet segments make two 360-degree turns around the circumference of said dipole ring magnet and such that a magnetic field in the direction of a diameter of said circumference of said dipole ring magnet is produced inside the dipole ring magnet, wherein each of said pillar-like magnet segments is devoid of only a lengthwise middle part to provide a vacant space in said middle part, and the length of said vacant space is selected according to the direction of magnetization of the pillar-like magnet segment with respect to the direction of said magnetic field such that said length is relatively long in pillar-like magnet segments which make relatively large contributions to said magnetic field and relatively short in pillar-like magnet segments which make relatively small contributions to said magnetic field and becomes maximum in pillar-like magnet segments which are magnetized approximately in the direction of said magnetic field and minimum in pillar-like magnet segment which are magnetized approximately in the direction opposite to the direction of said magnetic field.

2. A dipole ring magnet according to claim 1, wherein each of said pillar-like magnet segments is made up of two pillar-like magnet parts of approximately the same length which are aligned with and spaced from each other.

3. A dipole ring magnet according to claim 1, further comprising a nonmagnetic retainer in the form of a hollow cylinder in which said pillar-like magnet segments are retained.

4. A dipole ring magnet according to claim 3, further comprising a covering which is formed of a ferromagnetic material and directly covers the cylindrical outside surface of said retainer.

5. A dipole ring magnet according to claim 1, further comprising means for turning each of said pillar-like magnet segments about its longitudinal center axis by a desired angle to thereby minutely adjust said magnetic field.

6. A dipole ring magnet according to claim 1, wherein said pillar-like magnet segments have a quadrilateral cross-sectional shape.

7. A dipole ring magnet suitable for use in magnetron sputtering or magnetron etching, comprising a plurality of pillar-like magnet segments each of which is an anisotropic permanent magnet magnetized in a direction normal to its longitudinal axis, said pillar-like magnet segments being arranged around a circumference of said dipole ring magnet and differently oriented such that the directions of magnetization of the arranged magnet segments make two 360-degree turns around the circumference of said dipole ring magnet and such that a magnetic field in the direction of a diameter of said circumference of said dipole ring magnet is produced inside the dipole ring magnet, wherein each of said pillar-like magnet segments is devoid of a lengthwise middle part to provide a vacant space in said middle part, and the length of said vacant space is selected according to the position of the pillar-like magnet segment in the dipole ring magnet, wherein some of said pillar-like magnet segments is each provided with an auxiliary anisotropic magnet which covers at least a part of the side faces of each pillar-like magnet segment and is magnetized in a direction parallel to the longitudinal axis of the pillar-like magnet segment.

8. A dipole ring magnet according to claim 7, wherein the length of said vacant space is relatively great in pillar-like magnet segments which make relatively great contributions to said magnetic field and relatively short in pillar-like magnet segments which make relatively small contributions to said magnetic field.

9. A dipole ring magnet according to claim 7, wherein each of said pillar-like magnet segments is made up of two pillar-like magnet parts of approximately the same length which are aligned with and spaced from each other.

10. A dipole ring magnet according to claim 7, further comprising a nonmagnetic retainer in the form of a hollow cylinder in which said pillar-like magnet segments are retained.

11. A dipole ring magnet according to claim 10, further comprising a covering which is formed of a ferromagnetic material and covers the cylindrical outside surface of said retainer.

12. A dipole ring magnet according to claim 7, further comprising means for turning each of said pillar-like magnet segments about its longitudinal center axis by a desired angle to thereby minutely adjust said magnetic field.

13. A dipole ring magnet according to claim 7, wherein said pillar-like magnet segments have a quadrilateral cross-sectional shape.

* * * * *